United States Patent
Wang et al.

(10) Patent No.: US 8,883,400 B2
(45) Date of Patent: *Nov. 11, 2014

(54) COMPOSITIONS AND PROCESSES FOR PHOTOLITHOGRAPHY

(75) Inventors: Deyan Wang, Hudson, MA (US); Chunyi Wu, Shrewsbury, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/548,537

(22) Filed: Jul. 13, 2012

(65) Prior Publication Data

US 2013/0017487 A1 Jan. 17, 2013

Related U.S. Application Data

(63) Continuation of application No. 12/655,547, filed on Dec. 31, 2009, now Pat. No. 8,241,832.

(60) Provisional application No. 61/204,007, filed on Dec. 31, 2008.

(51) Int. Cl.
| | | |
|---|---|---|
| *G03F 7/004* | (2006.01) | |
| *G03F 7/039* | (2006.01) | |
| *G03F 7/11* | (2006.01) | |
| *G03F 7/26* | (2006.01) | |

(52) U.S. Cl.
USPC ............ 430/273.1; 430/270.1; 430/326

(58) Field of Classification Search
USPC ............ 430/270.1, 271.1, 273.1, 326, 908
See application file for complete search history.

(56) References Cited

U.S. PATENT DOCUMENTS

| | | | |
|---|---|---|---|
| 8,012,666 B2 | 9/2011 | Gallagher et al. | |
| 8,241,832 B2 * | 8/2012 | Wang et al. | 430/270.1 |
| 2006/0275697 A1 | 12/2006 | Hata et al. | |
| 2006/0292485 A1 * | 12/2006 | Ito et al. | 430/270.1 |
| 2008/0311506 A1 | 12/2008 | Allen et al. | |
| 2008/0311530 A1 | 12/2008 | Allen et al. | |
| 2009/0136878 A1 | 5/2009 | Kanna | |
| 2010/0021852 A1 | 1/2010 | Nishimura et al. | |
| 2010/0183977 A1 | 7/2010 | Wang et al. | |
| 2011/0207051 A1 | 8/2011 | Sanders et al. | |
| 2012/0028108 A1 | 2/2012 | Inagaki et al. | |
| 2012/0028198 A1 | 2/2012 | Nakamura et al. | |
| 2012/0225384 A1 * | 9/2012 | Wang et al. | 430/273.1 |

FOREIGN PATENT DOCUMENTS

| | | |
|---|---|---|
| EP | 1 806 370 | 7/2007 |
| EP | 2 062 950 | 5/2009 |
| EP | 2 078 983 | 7/2009 |

OTHER PUBLICATIONS

"Dipropylene glycol monomethyl ether", Sigma Aldrich, 2013.*
"Isoamyl ether", Sigma Aldrich, 2013.*
"4-methyl-2-pentanol", Sigma Aldrich, 2013.*
"2-methyl-1-butanol", Sigma Aldrich, 2013.*
Octan-2-ol, www.phtchemical.com, Mar. 2011.*
n-Decane, ScienceLab.com, Sep. 10, 2005.*
"DOW P-Series Glycol Ethers", Dow Chemical Company, Jul. 2002.*
Sanders et al.; "Self-segregating materials for immersion lithography"; Proceedings of the SPIE, vol. 6923, Feb. 25, 2008; pp. 692309-1-692309-12.

* cited by examiner

*Primary Examiner* — Anca Eoff
(74) *Attorney, Agent, or Firm* — Jonathan D. Baskin

(57) ABSTRACT

Topcoat layer compositions are provided that are applied above a photoresist composition. The compositions find particular applicability to immersion lithography processing.

16 Claims, No Drawings

COMPOSITIONS AND PROCESSES FOR PHOTOLITHOGRAPHY

This application is a Continuation of U.S. Non-Provisional application Ser. No. 12/655,547 filed Dec. 31, 2009 which application claims the benefit under 35 U.S.C. §119(e) of U.S. Provisional Application No. 61/204,007, filed Dec. 31, 2008, the entire contents of which are herein incorporated by reference.

This invention relates to topcoat layer compositions that may be applied above a photoresist composition in photolithography processing, such as immersion lithography processing. The invention finds particular applicability as a topcoat layer in an immersion lithography process for the formation of semiconductor devices.

Photoresists are photosensitive films used for transfer of an image to a substrate. A coating layer of a photoresist is formed on a substrate and the photoresist layer is then exposed through a photomask to a source of activating radiation. The photomask has areas that are opaque to the activating radiation and other areas that are transparent to the activating radiation. Exposure to activating radiation provides a photo-induced chemical transformation of the photoresist coating to thereby transfer the pattern of the photomask to the photoresist coated substrate. Following exposure, the photoresist is developed by contact with a developer solution to provide a relief image that permits selective processing of the substrate.

One approach to achieving nanometer (nm)-scale feature sizes in semiconductor devices is to use shorter wavelengths of light. However, the difficulty in finding materials that are transparent below 193 nm has led to the immersion lithography process to increase the numerical aperture of the lens by use of a liquid to focus more light into the film. Immersion lithography employs a relatively high refractive index fluid between the last surface of an imaging device (e.g., KrF or ArF light source) and the first surface on the substrate, for example, a semiconductor wafer. When using water (refractive index of 1.44 at a wavelength of 193 nm) as the immersion fluid, a line width at 193 nm of 35 nm is possible.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to ameliorate this problem, use of a topcoat layer over the photoresist layer as a barrier between the immersion fluid and underlying photoresist layer has been proposed. The use of topcoat layers in immersion lithography, however, presents various challenges. Topcoat layers can affect, for example, the process window, critical dimension (CD) variation and resist profile depending on characteristics such as topcoat refractive index, thickness, acidity, chemical interaction with the resist and soaking time. In addition, use of a topcoat layer can negatively impact device yield due, for example, to micro-bridging defects which prevent proper resist pattern formation.

To improve performance of topcoat materials, the use of self-segregating topcoat compositions to form a graded topcoat layer has been proposed, for example, in *Self-segregating Materials for Immersion Lithography*, Daniel P. Sanders et al, Advances in Resist Materials and Processing Technology XXV, Proceedings of the SPIE, Vol. 6923, pp. 692309-1-692309-12 (2008). A graded topcoat would theoretically allow for a tailored material having desired properties at both the immersion fluid and photoresist interfaces, for example, a high water receding angle at the immersion fluid interface and good developer solubility at the photoresist interface.

There is a continuing need in the art for improved self-segregating topcoat compositions for use in immersion lithography, and for their methods of use. Provided are new topcoat compositions and processes for immersion photolithography. Also provided are new compositions that can be used as an overcoat layer above a photoresist layer for use in non-immersion imaging processes.

In accordance with a first aspect of the invention, provided are compositions suitable for use in forming a topcoat layer over a layer of photoresist. The compositions include: a first resin comprising one or more acidic functional groups; a second resin that is different from the first resin, the second resin comprising as polymerized units a monomer of the formula (I):

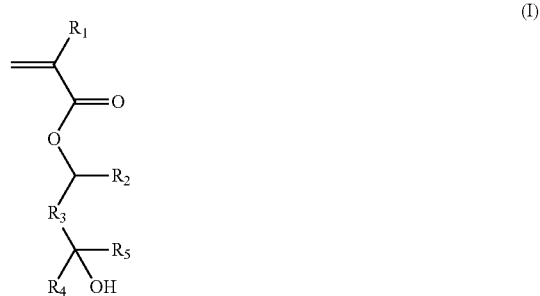

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups; and a solvent comprising a dialkyl glycol monoalkyl ether. The second resin has a lower surface energy than a surface energy of the first resin.

In further aspects of the invention, $R_2$ can be an optionally substituted C3 to C6 isoalkyl group or cycloalkyl group. In a further aspect, the acidic functional group of the first resin can be a strong acidic functional group such as a sulfonic acid group. In a further aspect, the composition can include a third resin different from the first and second resins, which third resin is fluorinated and comprises one or more acidic functional groups. In a further aspect, the second resin can further comprise as polymerized units a second monomer comprising one or more photoacid-labile groups. In a further aspect, the solvent further comprises an alcohol and an alkyl ether or an alkane.

In accordance with a further aspect of the invention, provided are coated substrates. The coated substrates include: a photoresist layer on a substrate; and a topcoat layer on the photoresist layer. The topcoat layer includes first and second resins as described above with respect to the first aspect, the second resin having a lower surface energy than a surface energy of the first resin, and a solvent comprising a dialkyl glycol monoalkyl ether. In accordance with a further aspect, the topcoat layer is a graded layer.

In accordance with a further aspect of the invention, provided are methods of processing a photoresist composition. The methods include: (a) applying a photoresist composition over a substrate to form a photoresist layer; (b) applying over the photoresist layer a topcoat composition as described above with respect to the first aspect; and (c) exposing the photoresist layer to actinic radiation. In accordance with a further aspect, the exposure can be an immersion exposure and the substrate can be a semiconductor wafer.

In certain aspects, topcoat layer compositions of the invention that are applied above a photoresist composition layer are self-segregating and form a graded topcoat layer, which can help at least to inhibit, and preferably to minimize or prevent, migration of components of the photoresist layer into an immersion fluid employed in an immersion lithography process. In addition, the water dynamic contact angle characteristics at the immersion fluid interface, such as the water receding angle, can be improved. Still further, the topcoat layer compositions provide topcoat layers having excellent developer solubility for both exposed and unexposed regions of the layer, for example, in an aqueous base developer.

As used herein, the term "immersion fluid" means a fluid (e.g., water) interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

In certain aspects, one or more resins of the topcoat composition will have two distinct repeat units (copolymers), three distinct repeat units (terpolymers), four distinct repeat units (tetra-polymers), five distinct repeat units (pentapolymers), or even higher order polymers.

Typical resins of the topcoat compositions of the invention may contain a variety of repeat units, including repeat units including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups.

In certain aspects, one or more resins of the coating composition will comprise one or more groups that are reactive during lithographic processing, for example, one or more photoacid labile groups that can undergo cleavage reactions in the presence of acid and heat, such as acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound.

The topcoat compositions of the invention may comprise a variety of materials, and typical resins of the compositions are higher molecular weight materials such as materials having a molecular weight in excess of about 3000, 4000 or 4500 daltons. One or more resins of the compositions can have a molecular weight in excess of 6000, 7000, 8000 or 9000 daltons.

The topcoat compositions of the invention may comprise one or more optional components in addition to the resin components, for example: one or more acid generator compounds such as one or more thermal acid generator (TAG) compounds and/or one or more photoacid generator (PAG) compounds; and one or more surfactant compounds.

It has been found that topcoat compositions of the invention can exhibit favorable static and dynamic water contact angles as evaluated in an immersion lithography process. See Burnett et al., *J. Vac. Sci. Techn. B*, 23 (6), pages 2721-2727 (November/December 2005) for a discussion of such water contact angles.

Typical imaging wavelengths of lithographic systems of the invention include sub-300 nm wavelengths such as 248 nm, and sub-200 nm wavelengths such as 193 nm. Particularly preferred photoresists for use in systems of the invention may contain a photoactive component (e.g., one or more photoacid generator compounds) and one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers described in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. Pat. No. 6,136,501, and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

3) a resin that contains repeat units that contain a hetero atom, particularly oxygen and/or sulfur (but other than an anhydride, i.e., the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norbornene group and/or an anhydride unit such as provided by polymerization of a maleic anhydride or itaconic anhydride. Such resins are disclosed in International Application Pub. No. WO 01/86353 A1 and U.S. Pat. No. 6,306,554.

4) a resin that contains fluorine substitution (fluoropolymer), for example, as may be provided by polymerization of tetrafluoroethylene, a fluorinated aromatic group such as fluoro-styrene compound, compounds that comprise a hexafluoroalcohol moiety, and the like. Examples of such resins are disclosed, for example, in International Application Pub. No. WO2000017712.

In immersion lithography methods of the invention, an immersion fluid having a refractive index of between about 1 and about 2 is suitably maintained between an exposure tool and the topcoat composition during the exposing. A variety of photoresists may be employed in these methods of the invention, for example, chemically-amplified positive-acting photoresists and negative-acting photoresists.

In some aspects of these methods of the invention the photoresist composition will not be not thermally treated prior to applying the overcoated topcoat composition. Also, in some aspects of these methods of the invention, the substrate with the applied photoresist composition and topcoat composition is thermally treated prior to exposing to remove solvent from both the applied photoresist composition and the applied topcoat composition.

Methods and systems of the invention can be used with a variety of imaging wavelengths, for example, radiation having a wavelength of less than 300 nm such as 248 nm or less than 200 such as 193 nm.

Topcoat Compositions

As discussed above, the topcoat compositions of the invention include a plurality of different resins, for example, two, three or more resins. Resins useful in the invention may be homopolymers, but more typically include a plurality of distinct repeat units, with two or three distinct units, i.e., copolymers or terpolymers, being typical.

A variety of resins may be employed in the topcoat compositions of the invention, including resins comprising polymerized acrylate groups, polyesters, and other repeat units and/or polymer backbone structures such as provided by, for example, poly(alkylene oxide), poly(meth)acrylic acid, poly(meth)acrylamides, polymerized aromatic (meth)acrylates, and polymerized vinyl aromatic monomers. In certain preferred systems, the coating composition may comprise at least three distinct resins, wherein the first, second and third resins each include at least two differing repeat units, more preferably, at least two of the first, second and third resins including at least three differing repeat units. The different resins suitably may be present in varying relative amounts.

The resins of the topcoat compositions of the invention may contain a variety of repeat units, including repeat units including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the resins will depend, for example, on the intended functionality of the resin.

In certain preferred aspects, one or more resins of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound. The presence of such groups can render the associated resin(s) more soluble in a developer solution, thereby aiding in developability and removal of the topcoat layer during a development process.

The resins of the topcoat compositions typically have relatively high molecular weights, for example, in excess of about 3000, 4000 or 4500, daltons. One or more resins of the compositions can have a molecular weight in excess of 6000, 7000, 8000 or 9000 daltons.

Typical resin systems of the inventive topcoat compositions include two or more, more typically three or more distinct resins. The resins are selected to tailor characteristics of the topcoat layer, with each generally serving a particular purpose or function. Such functions include, for example, one or more of photoresist profile adjusting, topcoat surface adjusting, reducing defects and reducing interfacial mixing between the topcoat and photoresist layers. The resin systems of the invention include a matrix resin, generally the resin present in the composition in the largest proportion and forming a major portion of the topcoat film, and one or more additive resins. At least one additive resin is present for surface adjusting purposes, for example, for improving immersion fluid contact angle characteristics. Exemplary such resins useful in the invention will now be described.

The matrix resin may include, for example, one or more repeating units, with two repeating units being typical. The matrix resin should provide a sufficiently high developer dissolution rate for reducing overall defectivity due, for example, to micro-bridging. The matrix resin may include, for example, a sulfonamide-containing monomer for enhancing the polymer developer dissolution rate. A typical developer dissolution rate for the matrix polymer is greater than 500 nm/second. The matrix resins typically are fluorinated for reducing or minimizing interfacial mixing between the topcoat layer and underlying photoresist. One or more repeating unit of the matrix resin can be fluorinated, for example, with a fluoroalkyl group such as a C1 to C4 fluoroalkyl group, typically fluoromethyl.

Exemplary matrix resin polymers in accordance with the invention include the following:

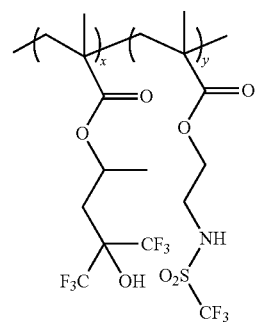

wherein x is from 0 to 90 wt % (weight percent) and y is from 10 to 100 wt %, based on the weight of the polymer. In an exemplary first matrix polymer, x/y is 90/10 wt %;

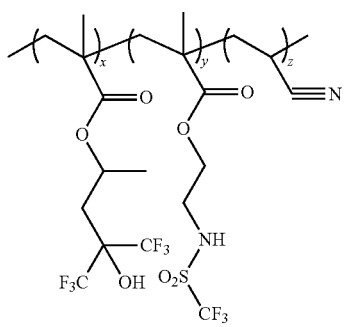

wherein x is from 0 to 85 wt %, y is from 10 to 80 wt % and z is from 5 to 20 wt % based on the weight of the polymer. In an exemplary matrix polymer, x/y/z are 40/45/15 wt %; and

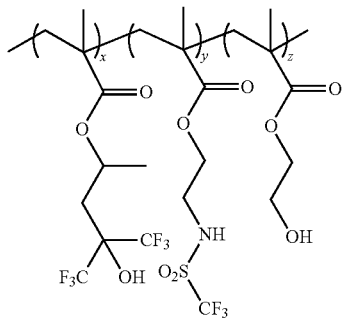

wherein x is from 0 to 85 wt %, y is from 10 to 80 wt % and z is from 5 to 20 wt % based on the weight of the polymer. In an exemplary matrix polymer, x/y/z are 40/45/15 wt %.

A first additive resin is provided in the topcoat composition to improve surface properties at the topcoat/immersion fluid interface. In particular, the first additive resin can beneficially increase the immersion fluid receding angle at the topcoat/immersion fluid interface, thereby allowing for faster scanning speeds. The first additive resin should have a significantly lower surface energy than and be substantially immiscible with the matrix polymer resin and other additive resins present in the system. In this way, the topcoat layer can be self-segregating, wherein the first additive resin migrates to the surface of the topcoat layer apart from other resins during coating. The resulting topcoat layer is thereby graded, being rich in the first additive resin at the topcoat/immersion fluid interface. The first additive resin may further include one or more acid labile functional groups to enhance solubility in a developer solution after processing the photoresist, for example, after exposure to activating radiation and post-exposure baking. The first additive resin typically has excellent developability both before and after photolithographic treatment. This resin typically exhibits a dark field developer dissolution rate, for example, of 1 Å/second or higher. The first additive resin comprises as polymerized units a monomer of the formula (I):

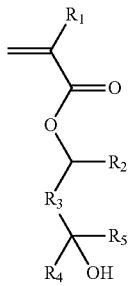

(I)

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups.

Exemplary first additive resins in accordance with the invention include as polymerized units monomers of the formulae M1, M2 and M3 as follows:

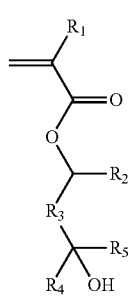

M1

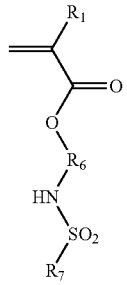

M2

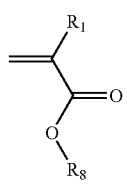

M3 wherein $R_1$'s are independently hydrogen or a C1 to C6 optionally substituted alkyl or fluoroalkyl group, $R_2$ is an optionally substituted cycloalkyl such as cyclohexyl, or branched alkyl group, for example, an isoalkyl group such as isopropyl or isobutyl, $R_3$ is an optionally substituted alkylene group, $R_4$ and $R_5$ are independently C1 to C4 fluoroalkyl groups such as fluoromethyl or fluoroethyl, $R_6$ is an optionally substituted C1 to C6 alkylene, for example, ethylene or propylene, $R_7$ is a C1 to C4 fluoroalkyl group such as fluoromethyl or fluoroethyl and $R_8$ is an acid labile leaving group, preferably having a low activation energy. Suitable monomers containing such acid labile leaving groups for use in the first additive resin include, for example, the following:

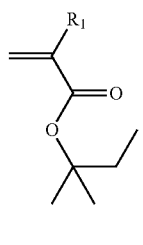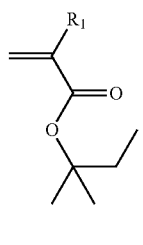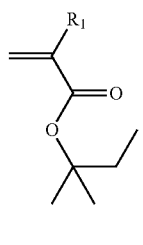

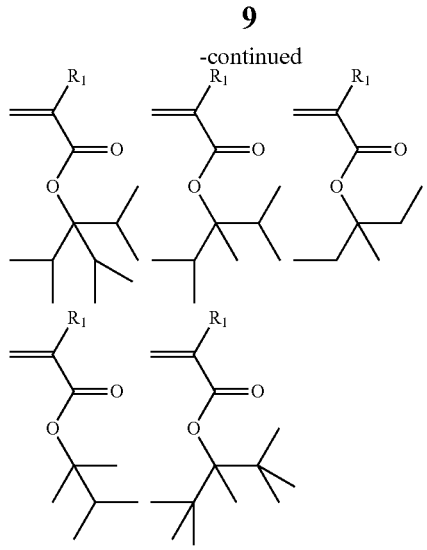

wherein $R_1$ is as defined above with respect to monomers M1-M3. Each of monomers M1, M2 and M3 in the foregoing exemplary formulas are believed to provide beneficial characteristics to the first additive resin. For example, it is believed that: monomer M1 allows for enhanced dynamic contact angles, for example, increased receding angle and decreased sliding angle, and for improving developer affinity and solubility; monomer M2 improves dark field developer dissolution rate while maintaining beneficial dynamic contact angles; and monomer M3 provides for enhanced developer dissolution in exposed areas due to the acid-labile groups, and improves dynamic contact angles, particularly increasing the immersion fluid receding angle to, for example, greater than 72°.

As discussed above, the resin system of the topcoat compositions can include one or more additional resins. In a particularly suitable composition, a second additive resin is provided in addition to the matrix resin and first additive resin for purposes of tuning the resist feature profile and for controlling resist top loss. The second additive resin typically includes one or more strong acid functional groups, for example, a sulfonic acid group. Typically the second additive resin includes one or more sulfonic acid functional groups. The second additive resin should be miscible with the matrix polymer while, as discussed above, generally immiscible with the first additive resin.

Exemplary polymers useful in the invention as the second additive resin include the following:

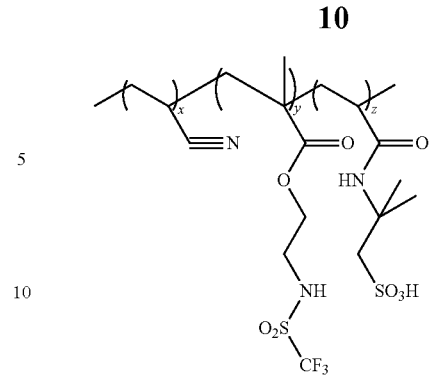

wherein x is from 5 to 20 wt %, y is from 75 to 94 wt % and z is from 1 to 5 wt % based on the weight of the polymer. In an exemplary polymer, x/y/z are 15/80/5 wt %;

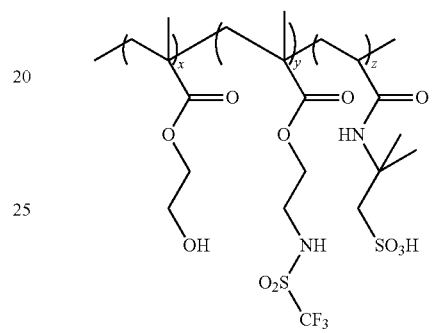

wherein x is from 5 to 20 wt %, y is from 75 to 94 wt % and z is from 1 to 5 wt % based on the weight of the polymer;

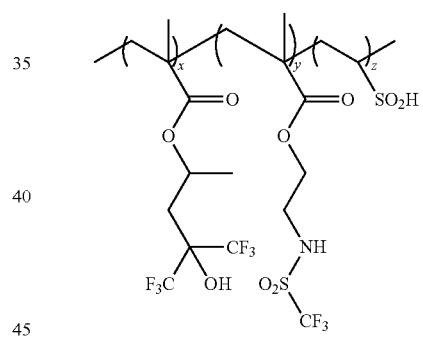

wherein x is from 0 to 89 wt %, y is from 10 to 99 wt % and z is from 1 to 5 wt % based on the weight of the polymer. In an exemplary polymer, x/y/z are 10/87/3 wt %;

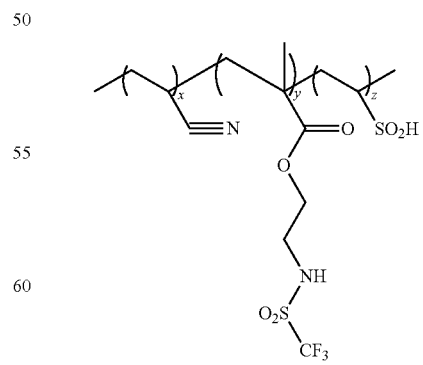

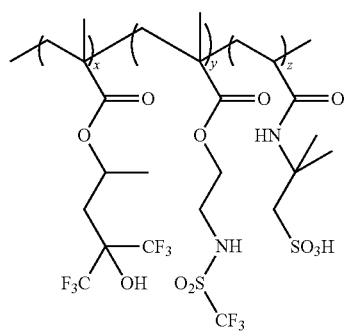

wherein x is from 0 to 89 wt %, y is from 10 to 99 wt % and z is from 1 to 5 wt % based on the weight of the polymer. In an exemplary polymer, x/y/z are 10/85/5 wt %;

wherein x is from 5 to 20 wt %, y is from 75 to 94 wt % and z is from 1 to 5 wt % based on the weight of the polymer. In an exemplary polymer, x/y/z are 15/82/3 wt %; and

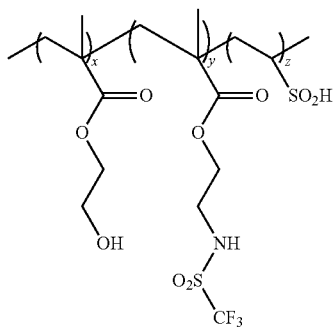

wherein x is from 5 to 20 wt %, y is from 75 to 94 wt % and z is from 1 to 5 wt % based on the weight of the polymer. In an exemplary polymer, x/y/z are 10/87/3 wt %. Wherein x is from 5 to 20 wt %, y is from 75 to 94 wt % and z is from 1 to 5 wt % based on the weight of the polymer. In an exemplary polymer, x/y/z are 10/87/3 wt %.

As discussed above, the topcoat compositions may contain one or more acid generator compounds, for example, one or more thermal acid generator compounds and/or one or more photoacid generator compounds. Optionally, the topcoat compositions may be free of such acid generator compounds. In this regard, acid generator compounds can be provided by migration from the underlying photoresist into the topcoat layer during processing making their separate addition as part of the topcoat compositions unnecessary. If desired, suitable photoacid generator compounds for use in the topcoat composition are discussed below with respect to photoresist compositions and particularly include non-ionic compounds such as imidosulfonates, for example, compounds of the following formula:

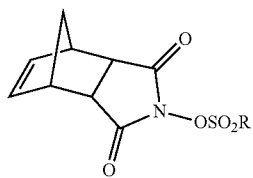

wherein R is camphor, adamantane, alkyl (e.g. $C_{1-12}$ alkyl) and perfluoroalkyl such as perfluoro($C_{1-12}$alkyl), particularly perfluorooctanesulfonate and perfluorononanesulfonate. A particularly preferred photoacid generator compound for use in a topcoat composition is N-[(perfluorooctane-sulfonyeoxy]-5-norbornene-2,3-dicarboximide.

Thermal acid generator compounds also may be employed in topcoat compositions of the invention including ionic or substantially neutral thermal acid generators, for example, an ammonium arenesulfonate salt.

If employed, one or more acid generators may be utilized in relatively small amounts in a topcoat composition, for example, 0.1 to 10 wt % of the total of the dry components of the composition (all components except solvent carrier), such as about 2 wt % of the total dry components.

Such use of one or more acid generator compounds can favorably impact lithographic performance, particularly resolution, of the developed image patterned in an underlying resist layer.

A further optional additive of topcoat compositions of the invention are one or more surfactants, which can promote formation of a substantially uniform coating layer of the overcoated composition. A variety of surfactants may be employed. Typical surfactants exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$)(ICI), BRIJ® 58 ($C_{16}H_{33}(OCH_2CH_2)20$ OH)(ICI). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

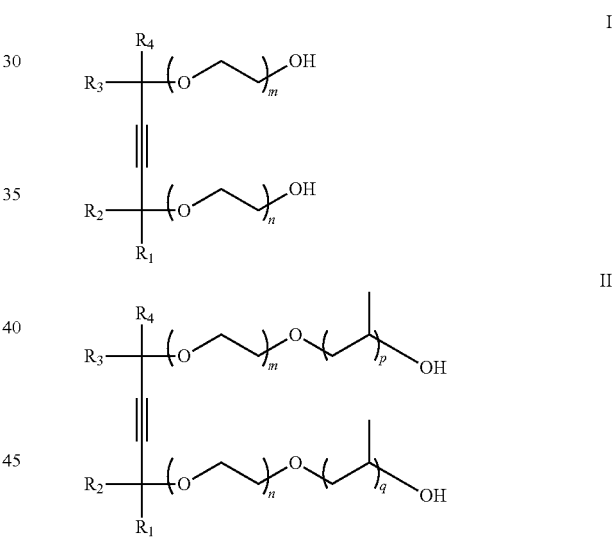

wherein in those formulae R1 and R4 are a straight or a branched alkyl chain suitably having from 3 to 10 carbon atoms; R2 and R3 are either. H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO copolymers PLURONIC® 25R2, L121, L123, L31, L81, L101 and P123. (BASF, Inc.).

One or more surfactants may be suitably present in relatively small amounts, for example, less than 5, 4, 3, 2, 1 or 0.5 weight percent relative to weight of total solids (total solids being all compositions components except solvent carrier).

Preferred topcoat composition layers will have an index of refraction of about 1.4 or greater at 193 nm including about 1.47 or greater at 193 nm. Additionally, for any particular system, the index of refraction can be tuned by changing the composition of one or more resins of the topcoat composition, including by altering the ratio of components of a resin blend, or composition of any of the resin(s) of a topcoat composition. For instance, increasing the amount of organic content in a topcoat layer composition can provided increased refractive index of the layer.

Preferred topcoat layer compositions will have a refractive index between of the immersion fluid and the refractive index of the photoresist at the target exposure wavelength, for example, 193 nm or 248 nm.

Typical solvent materials to formulate and cast a topcoat composition are any which dissolve or disperse the components of the topcoat layer composition but do not appreciably dissolve an underlying photoresist layer. More particularly, suitable solvents to formulate a topcoat composition include one or more of, but are not limited to, alcohols such as n-butanol and alkylene glycols, such as propylene glycol. Alternatively non-polar solvents such as aliphatic and aromatic hydrocarbons, and alkyl ethers such as dodecane, isooctane and isopentyl ether may be used. One or more solvent in the solvent system can individually be in a substantially pure form, meaning isomers of the solvent molecule are present in that solvent in an amount less than 5 wt %, for example, less than 2 wt % or less than 1 wt %. Optionally, the solvent can include a mixture of isomers of the solvent molecule, wherein the isomers are present in an amount greater than 5 wt %, for example, greater than 10 wt %, greater than 20 wt %, greater than 40 wt %, greater than 60 wt %, greater than 80 wt % or greater than 90 wt %. Preferably, a mixture of different solvents, for example, two, three or more solvents, is used to achieve effective phase separation of the segregating, first additive resin from other polymer(s) in the composition and to reduce the viscosity of the formulation which allows for reduction in the dispense volume.

In an exemplary aspect, a three-solvent system can be used in the topcoat compositions of the invention. The solvent system can include, for example, a primary solvent, a thinner solvent and an additive solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is typically present in an amount of from 30 to 80 wt % based on the solvent system.

The thinner solvent is present to lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1$—O—$R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. Particularly suitable alkyl ethers include, for example, isobutyl ether, isopentyl and isobutyl isohexyl, isomers thereof and mixtures thereof. The thinner solvent is typically present in an amount of from 10 to 70 wt % based on the solvent system.

The additive solvent is present to facilitate phase separation between the phase segregation resin and other resin(s) in the topcoat composition to facilitate a graded topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers, such as those of the formula:

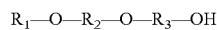

wherein $R_1$ is an optionally substituted C1 to C2 alkyl group and $R_2$ and $R_3$ are independently chosen from optionally substituted C2 to C4 alkyl groups, and mixtures of such hydroxy alkyl ethers including isomeric mixtures. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 3 to 15 wt % based on the solvent system.

A particularly suitable three-solvent system includes 4-methyl-2-pentanol/isopentyl ether/dipropylene glycol monomethyl ether in a ratio by weight of 49/45/6. While the exemplary solvent system has been described with respect to a three-component system, it should be clear that additional solvents may be used. For example, one or more additional primary solvent, thinner solvent, additive solvent and/or other solvent may be employed.

A topcoat or composition may be suitably prepared by admixture of the resins into one or more polar solvents such as those identified above or alternatively one or more non-polar solvents such as the aliphatic and aromatic hydrocarbons identified above. The viscocity of the entire composition is typically from 1.5 to 2 centipoise (cp), for example, from 1.6 to 1.9 cp, and is typically about 1.8 cp.

The examples which follows provide exemplary preparations of topcoat compositions of the invention.

Photoresists

A wide variety of photoresist compositions may be used in combination with topcoat layer compositions and processes of the invention.

As discussed above, typical photoresists for use in accordance with the invention include positive-acting or negative-acting chemically amplified photoresists, i.e., positive-acting resist compositions which undergo a photoacid-promoted deprotection reaction of acid labile groups of one or more composition components to render exposed regions of a coating layer of the resist more soluble in an aqueous developer than unexposed regions, and negative-acting resist compositions which undergo a photoacid-promoted crosslinking reaction to render exposed regions of a coating layer of the resist less developer soluble than unexposed regions. Of these, positive-acting materials are typical. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of lithography systems of the invention. Acetal photoacid-labile groups also will be preferred.

The photoresists useful in accordance with the invention typically comprise a resin component and a photoactive component. Typically, the resin has functional groups that impart alkaline aqueous developability to the resist composition. For example, typical are resin binders that comprise polar functional groups such as hydroxyl or carboxylate. Typically, a resin component is used in a resist composition in an amount sufficient to render the resist developable with an aqueous alkaline solution.

For imaging at wavelengths greater than 200 nm, such as 248 nm, phenolic resins are typical. Typical phenolic resins are poly(vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also typical for imaging at wavelengths greater than 200 nm, such as 248 nm are chemically amplified photoresists that comprise in admixture a photoactive component and a resin component that comprises a copolymer containing both phenolic and non-phenolic units. For example, one typical group of such copolymers has acid labile groups substantially, essentially or completely only on non-phenolic units of the copolymer, particularly alkylacrylate photoacid-labile groups, i.e., a phenolic-alkyl acrylate copolymer. One especially preferred copolymer binder has repeating units x and y of the following formula:

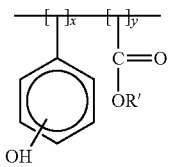

wherein the hydroxyl group is present at either the ortho, meta or para positions throughout the copolymer, and R' is an optionally substituted alkyl having 1 to about 18 carbon atoms, more typically 1 to about 6 to 8 carbon atoms. Tert-butyl is a generally preferred R' group. An R' group may be optionally substituted by, for example, one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and an optionally substituted alkyl acrylate such as t-butylacrylate and the like may be condensed under free radical conditions as known in the art. The substituted ester moiety, i.e., R'—O—C(=O)—, moiety of the acrylate units serves as the acid labile groups of the resin and will undergo photoacid induced cleavage upon exposure of a coating layer of a photoresist containing the resin. Typically, the copolymer will have a $M_w$ of from about 8,000 to about 50,000, more typically about 15,000 to about 30,000 with a molecular weight distribution of about 3 or less, more typically a molecular weight distribution of about 2 or less. Non-phenolic resins, for example, a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other typical resins that have acid-labile deblocking groups for use in a positive-acting chemically-amplified photoresist of the invention have been disclosed in European Published Application EP0829766A2 (resins with acetal and ketal resins) and European Published Application EP0783136A2 (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

For imaging at sub-200 nm wavelengths such as 193 nm, a typical photoresist contains one or more polymers that are substantially, essentially or completely free of phenyl or other aromatic groups. For example, for sub-200 nm imaging, typical photoresist polymers contain less than about 5 mole percent (mole %) aromatic groups, more typically less than about 1 or 2 mole % aromatic groups, more typically less than about 0.1, 0.02, 0.04 and 0.08 mole % aromatic groups, and still more typically less than about 0.01 mole % aromatic groups. Particularly useful polymers are completely free of aromatic groups. Aromatic groups can be highly absorbing of sub-200 nm radiation and thus are generally undesirable for polymers used in photoresists imaged with such short wavelength radiation.

Suitable polymers that are substantially or completely free of aromatic groups and may be formulated with a PAG to provide a photoresist for sub-200 nm imaging are disclosed in European Published Application EP930542A1 and U.S. Pat. Nos. 6,692,888 and 6,680,159.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof have been disclosed in European Patent Nos. 0164248B1 and 0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125.

For imaging at sub-200 nm wavelengths such as 193 nm, typical negative-acting photoresists are disclosed in International Application Pub. No. WO 03077029.

The resin component of resists useful in the invention are typically used in an amount sufficient to render an exposed coating layer of the resist developable such as with an aqueous alkaline solution. More particularly, a resin binder will suitably comprise 50 to about 90 wt % of total solids of the resist. The photoactive component should be present in an amount sufficient to enable generation of a latent image in a coating layer of the resist. More specifically, the photoactive component will suitably be present in an amount of from about 1 to 40 wt % of total solids of a resist. Typically, lesser amounts of the photoactive component will be suitable for chemically amplified resists.

The resist compositions useful in the invention also comprise a PAG employed in an amount sufficient to generate a latent image in a coating layer of the resist upon exposure to activating radiation. Typical PAGs for imaging at 193 nm and 248 nm imaging include imidosulfonates such as compounds of the following formula:

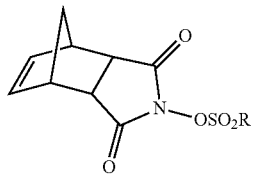

wherein R is camphor, adamantane, alkyl (e.g., $C_{1-12}$ alkyl) or perfluoroalkyl such as perfluoro($C_{1-12}$alkyl), particularly perfluorooctanesulfonate and perfluorononanesulfonate. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGs 1 and 2:

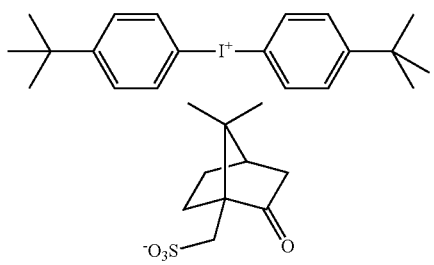
(PAG 1)

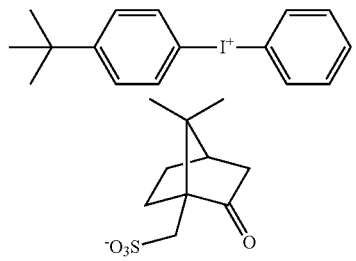
(PAG 2)

Such sulfonate compounds can be prepared as disclosed in European Patent No. 0783136B1, which details the synthesis of above PAG 1.

Also suitable are the above two iodonium compounds complexed with anions other than the above-depicted camphorsulfonate groups. In particular, typical anions include those of the formula $RSO_3$—where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGs also may be employed in photoresists used in accordance with the invention. Particularly for 193 nm imaging, generally typical are PAGs that do not contain aromatic groups, such as the above-mentioned imidosulfonates, in order to provide enhanced transparency.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 5 to 30 wt % based on the total weight of a resist's dry components.

Negative-acting photoresists useful in the invention typically will contain a crosslinking component. The crosslinking component is typically present as a separate resist component Amine-based crosslinkers often will be preferred such as a melamine, for example, the Cymel melamine resins.

The photoresists useful in the invention are generally prepared following known procedures. For example, a resist of the invention can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 wt % based on the total weight of the photoresist composition. Blends of such solvents also are suitable.

Lithographic Processing

Liquid photoresist compositions can be applied to a substrate such as by spin coating, dipping, roller coating or other conventional coating technique, with spin coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like may also be suitably employed. Photoresists also may be suitably applied over an antireflective layer, particularly an organic antireflective layer.

A topcoat composition of the invention can be applied over the photoresist composition by any suitable method such as described above with reference to the photoresist compositions, with spin coating being typical.

Following coating of the photoresist onto a surface, it may be dried by heating to remove the solvent until typically the photoresist coating is tack free, or as discussed above, the photoresist layer may be dried after the topcoat layer composition has been applied and the solvent from both the photoresist composition and topcoat composition layers substantially removed in a single thermal treatment step.

The photoresist layer with topcoat composition layer is then exposed to patterned radiation activating for the photoactive component of the photoresist.

In an immersion lithography system, the space between the exposure tool (particularly the projection lens) and the photoresist coated substrate is occupied by an immersion fluid, such as water or water mixed with one or more additives such as cesium sulfate which can provide a fluid of enhanced refractive index. Typically, the immersion fluid (e.g., water) has been treated to avoid bubbles, for example, degassing the water to avoid nanobubbles.

References herein to "immersion exposing" or other similar term indicates that exposure is conducted with such a fluid layer (e.g. water or water with additives) interposed between an exposure tool and the coated photoresist composition layer.

During the exposure step (whether immersion where fluid is interposed, or non-immersion where such fluid is not interposed), the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

As discussed above, photoresist compositions may be photoactivated by a short exposure wavelength, particularly a sub-300 and sub-200 nm exposure wavelength, with 248 nm and 193 nm being particularly preferred exposure wavelengths, as well as EUV and 157 nm. Following exposure, the film layer of the composition is typically baked at a temperature ranging from about 70° C. to about 160° C.

Thereafter, the film is developed, typically by treatment with an aqueous base developer chosen from quaternary ammonium hydroxide solutions such as a tetra-alkyl ammonium hydroxide solutions; amine solutions, typically a 0.26 N tetramethylammonium hydroxide such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, for example, the manufacture of silicon dioxide wafers, suitable etchants include a gas etchant such as a halogen plasma etchant such as a chlorine- or fluorine-based etchant such a $Cl_2$ or $CF_4/CHF_3$ etchant applied as a plasma stream. After such processing, resist may be removed from the processed substrate using known stripping procedures.

The following non-limiting examples are illustrative of the invention.

EXAMPLES 1-5

Topcoat Composition Preparation

Topcoat compositions of the invention are prepared by admixing the following components in the following amounts.

Example 1 Composition 1. 0.145 grams (g) of a poly(4,4,4-trifluoro-3-hydroxy-1-methyl-3-(trifluoromethyl)butyl 2-methacrylate-co-2{[(trifluoromethyl)sulfonyl]amino}ethyl 2-methacrylate)) in a 90/10 ratio by weight
2. 0.019 g of a poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) in a 55/25/20 ratio by weight
3. 0.3 g dipropylene glycol monomethyl ether, mixture of isomers
4. 1.0 g isopentyl ether, mixture of isomers
5. 8.54 g 4-methyl-2-pentanol Example 2 Composition 1. 0.16 g of a poly(4,4,4-trifluoro-3-hydroxy-1-methyl-3-(trifluoromethyebutyl 2-methacrylate-co-2-{[(trifluoromethyl)sulfonyl]amino}ethyl 2-methacrylate)) in an 80/20 ratio by weight
2. 0.02 g of a poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) in 55/25/20 ratio by weight
3. 0.5 g dipropylene glycol monomethyl ether, mixture of isomers
4. 4.0 g isopentyl ether, mixture of isomers
5. 5.33 g of 4-methyl-2-pentanol Example 3 Composition 1. 0.16 g of a poly(4,4,4-trifluoro-3-hydroxy-1-methyl-3-(trifluoromethyebutyl 2-methacrylate-co-2-{[(trifluoromethyl)sulfonyl]amino}ethyl 2-methacrylate)) in an 80/20 ratio by weight 2. 0.02 g of a poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) in a 55/25/20 ratio by weight
3. 0.6 g dipropylene glycol monomethyl ether, mixture of isomers
4. 5.0 g of isopentyl ether, mixture of isomers
5. 4.23 g of 4-methyl-2-pentanol

Example 4 Composition 1. 0.16 g of a poly(4,4,4-trifluoro-3-hydroxy-1-methyl-3-(trifluoromethyl)butyl 2-methacrylate-co-2-{[(trifluoromethyl)sulfonyl]amino}ethyl 2-methacrylate)-co-acrylonitrile) in 40/45/15 ratio by weight
2. 0.019 g of a poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) in 55/25/20 ratio by weight
3. 0.6 g dipropylene glycol monomethyl ether, mixture of isomers
4. 4.0 g of isopentyl ether, mixture of isomers
5. 5.23 g of 4-methyl-2-pentanol

Example 5 Composition 1. 0.16 g of a poly(2-{[(trifluoromethyl)sulfonyl]amino}ethyl 2-methacrylate)-co-acrylonitrile) in an 85/15 ratio by weight
2. 0.02 g of a poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) in a 55/25/20 ratio by weight
3. 0.6 g of dipropylene glycol monomethyl ether, mixture of isomers
4. 4.0 g isopentyl ether, mixture of isomers
5. 5.23 g of 4-methyl-2-pentanol

EXAMPLES 6-16

Topcoat Composition Preparation

Topcoat compositions of the invention were prepared by admixing the following components in the following amounts.

Example 6 Composition 1. 0.41 g of 13.3 wt % solution of poly(4,4,4-trifluoro-3-hydroxy-1-methyl-3-(trifluoromethyl)butyl 2-methacrylate-co-2-{[(trifluoromethyl)sulfonyl]amino}ethyl 2-methacrylate) (90/10 ratio by weight) in 4-methyl-2-pentanol
2. 0.36 g of 10.0 wt % solution of poly(2{[(trifluoromethyl)sulfonyl]amino}ethyl 2-methacrylate-co-2-Acrylamido-2-Methyl-1-propanesulfonic acid) (95/5 ratio by weight) in 4-methyl-2-pentanol
3. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
4. 0.15 g of dipropylene glycol monomethyl ether, mixture of isomers
5. 0.5 g of isopentyl ether, mixture of isomers
6. 3.53 g of 4-methyl-2-pentanol

Example 7 Composition 1. 0.41 g of 13.3 wt % solution of poly(4,4,4-trifluoro-3-hydroxy-1-methyl-3-(trifluoromethyl)butyl 2-methacrylate-co-2{[(trifluoromethyl)sulfonyl]amino}ethyl 2-methacrylate) (90/10 ratio by weight) in 4-methyl-2-pentanol
2. 0.36 g of 10.0 wt % solution of poly(2{[(trifluoromethyl)sulfonyl]amino}ethyl 2-methacrylate-co-2-Acrylamido-2-Methyl-1-propanesulfonic acid) (95/5 ratio by weight) in 4-methyl-2-pentanol
3. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
4. 0.15 g of dipropylene glycol monomethyl ether, mixture of isomers
5. 1.0 g of isopentyl ether, mixture of isomers
6. 3.03 g of 4-methyl-2-pentanol

Example 8 Composition 1. 0.41 g of 13.3 wt % solution of poly(4,4,4-trifluoro-3-hydroxy-1-methyl-3-(trifluoromethyl)butyl 2-methacrylate-co-2{[(trifluoromethyl)sulfonyl]amino}ethyl 2-methacrylate) (90/10 ratio by weight) in 4-methyl-2-pentanol
2. 0.36 g of 10.0 wt % solution of poly(2{[(trifluoromethyl)sulfonyl]amino}ethyl 2-methacrylate-co-2-Acrylamido-2-Methyl-1-propanesulfonic acid) (95/5 ratio by weight) in 4-methyl-2-pentanol
3. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
4. 0.15 g of dipropylene glycol monomethyl ether, mixture of isomers
5. 1.5 g of isopentyl ether, mixture of isomers
6. 2.53 g of 4-methyl-2-pentanol

Example 9 Composition 1. 0.41 g of 13.3 wt % solution of poly(4,4,4-trifluoro-3-hydroxy-1-methyl-3-(trifluoromethyl)butyl 2-methacrylate-co-2{[(trifluoromethyl)sulfonyl]amino}ethyl 2-methacrylate) (90/10 ratio by weight) in 4-methyl-2-pentanol
2. 0.36 g of 10.0 wt % solution of poly(2{[(trifluoromethyl)sulfonyl]amino}ethyl 2-methacrylate-co-2-Acrylamido-2-Methyl-1-propanesulfonic acid) (95/5 ratio by weight) in 4-methyl-2-pentanol
3. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
4. 0.15 g of dipropylene glycol monomethyl ether, mixture of isomers
5. 2.0 g of isopentyl ether, mixture of isomers
6. 2.03 g of 4-methyl-2-pentanol

Example 10 Composition 1. 0.41 g of 21.0 wt % solution of poly(4,4,4-trifluoro-3-hydroxy-1-methyl-3-(trifluoromethyl)butyl 2-methacrylate-co-2{[(trifluoromethyl)sulfonyl]amino}ethyl 2-methacrylate-co-2-Acrylamido-2-Methyl-1-propanesulfonic acid) (69/30/1 ratio by weight) in 4-methyl-2-pentanol
2. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 11 Composition 1. 0.41 g of 21.0 wt % solution of poly(2{[(trifluoromethyl)sulfonyl]amino}ethyl 2-methacrylate-co-Acrylonitrile-co-2-Acrylamido-2-Methyl-1-propanesulfonic acid) (83/15/2 ratio by weight) in 4-methyl-2-pentanol
   2. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 12 Composition 1. 0.41 g of 21.0 wt % solution of poly(2{[(trifluoromethyl)sulfonyl]amino}ethyl 2-methacrylate-co-methacrylic acid-co-trifluroethyl methacrylate) (65/25/10 ratio by weight) in 4-methyl-2-pentanol
   2. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 13 Composition 1. 0.41 g of 21.0 wt % solution of poly(2{[(trifluoromethyl)sulfonyl]amino}ethyl 2-methacrylate-co-methacrylic acid-co-trifluroethyl methacrylate) (65/25/10 ratio by weight) in 4-methyl-2-pentanol
   2. 0.05 g of 21.0 wt % solution of poly(4,4,4-trifluoro-3-hydroxy-1-methyl-3-(trifluoromethyl)butyl 2-methacrylate-co-1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (30/30/20/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 14 Composition 1. 0.41 g of 21.0 wt % solution of poly(2{[(trifluoromethyl)sulfonyl]amino}ethyl 2-methacrylate-co-methacrylic acid) (80/20 ratio by weight) in 4-methyl-2-pentanol
   2. 0.05 g of 21.0 wt % solution of poly(4,4,4-trifluoro-3-hydroxy-1-methyl-3-(trifluoromethyl)butyl 2-methacrylate-co-1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (30/30/20/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 15 Composition 1. 0.41 g of 21.0 wt % solution of poly(2{[(trifluoromethyl)sulfonyl]amino}ethyl 2-methacrylate-co-methacrylic acid) (80/20 ratio by weight) in 4-methyl-2-pentanol
   2. 0.05 g of 21.0 wt % solution of poly(1,1,1-trifluor-2-hydroxy-6-methyl-2-(trifluoromethyl)heptane-4-yl methacrylate-co-2-{[(trifluoromethyl)sulfonyl]amino}ethyl 2-methacrylate)-co-2,3,3-trimethyl 2-methacrylate) (55/25/20 ratio by weight) in propylene glycol methyl ether acetate
   3. 0.15 g of dipropylene glycol monomethyl ether, mixture of isomers
      4. 0.5 g of isopentyl ether, mixture of isomers
      5. 3.89 g of 4-methyl-2-pentanol Example 16

Coating and Water Contact Angle Evaluations

The compositions of Examples 6-16 were spin coated on a dried photoresist layer disposed on a silicon wafer substrate. Water contact angles were evaluated for the coating compositions. The water contact angles evaluated include static ($\theta_{Static}$), receding ($\theta_{Receding}$), advancing ($\theta_{Advancing}$) and sliding ($\theta_{Sliding}$) in general accordance with the procedures disclosed in Burnett et al., *J. Vac. Sci. Techn. B*, 23 (6), pages 2721-2727 (November/December 2005). The results are set forth in Table 1, below.

TABLE 1

| Example | Contact Angles θ (°) | | | |
| --- | --- | --- | --- | --- |
| | $\theta_{Static}$ | $\theta_{Receding}$ | $\theta_{Advancing}$ | $\theta_{Sliding}$ |
| Example 6 | 90 | 73.4 | 92.7 | 24.5 |
| Example 7 | 89.7 | 73.5 | 93.6 | 22.1 |
| Example 8 | 89.4 | 73 | 92.7 | 26.1 |
| Example 9 | 87.8 | 73.4 | 92.9 | 23.5 |
| Example 10 | 91.5 | 74.2 | 93.8 | 23.5 |
| Example 11 | 91.3 | 78.5 | 94.7 | 19.6 |
| Example 12 | 91.1 | 80.3 | 94.9 | 19.9 |
| Example 13 | 89.6 | 77.6 | 94 | 21.2 |
| Example 14 | 89.6 | 77.4 | 93.5 | 22.3 |
| Example 15 | 91.9 | 79.8 | 94.7 | 20.1 |

Example 17

Immersion Lithography

The coating compositions of Examples 1-15 are each spin coated onto a respective silicon wafer having a coating layer of a deblocking-methacrylate based 193 nm positive photoresist. The photoresist layer for each wafer is then imaged in an immersion lithography system with patterned radiation having a wavelength of 193 nm.

What is claimed is:

1. A composition suitable for use in forming a topcoat layer over a layer of photoresist, the composition comprising:
   a first matrix resin comprising one or more acidic functional groups;
   a second additive resin that is different from and substantially immiscible with the first resin, the second resin comprising as polymerized units a monomer of the formula (I):

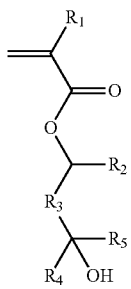

(I)

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups;
   wherein the second resin has a lower surface energy than a surface energy of the first resin; and
   a mixture of solvents effective to achieve phase separation of the additive resin from other resin(s) in the composition during spin-coating.

2. The composition of claim 1, wherein $R_2$ is an optionally substituted C3 to C6 isoalkyl group.

3. The composition of claim 1, wherein the composition, when used in an immersion lithography process with water as the immersion fluid, provides a receding contact angle of greater than 72°.

4. The composition of claim 1, wherein the mixture of solvents comprises a dialkyl glycol monoalkyl ether.

5. The composition of claim 1, wherein the second resin further comprises as polymerized units a second monomer comprising one or more acid-labile groups.

6. The composition of claim 1, wherein the mixture of solvents comprises: a primary solvent and an additive solvent having a boiling point higher than that of the primary solvent, wherein the primary solvent has a boiling point of from 120 to 140° C. and the additive solvent has a boiling point of from 170 to 200° C.

7. The composition of claim 6, wherein the additive solvent is present in an amount of from 3 to 15 wt % based on the mixture of solvents.

8. A composition suitable for use in forming a topcoat layer over a layer of photoresist, the composition comprising:
   a first matrix resin comprising one or more acidic functional groups;
   a second additive resin that is different from the first resin, the second resin comprising as polymerized units a monomer of the formula (I):

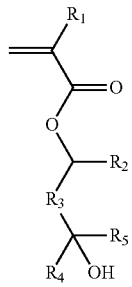

(I)

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups;
   wherein the second resin has a lower surface energy than a surface energy of the first resin; and
   a mixture of solvents effective to achieve phase separation of the additive resin from other resin(s) in the composition during spin-coating, wherein the mixture of solvents comprises: a primary solvent and an additive solvent having a boiling point higher than that of the primary solvent, wherein the primary solvent has a boiling point of from 120 to 140° C. and the additive solvent has a boiling point of from 170 to 200° C.; wherein the mixture of solvents comprises: a dialkyl glycol monoalkyl ether; an alcohol; and an alkyl ether or an alkane.

9. A method of processing a photoresist composition, comprising:
   (a) applying a photoresist composition over a substrate to form a photoresist layer;
   (b) applying over the photoresist layer a topcoat composition, the composition comprising:
      a first matrix resin comprising one or more acidic functional groups;
      a second additive resin that is different from and substantially immiscible with the first resin, the second resin comprising as polymerized units a monomer of the formula (I):

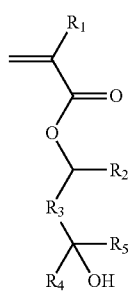

(I)

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups;
   wherein the second resin has a lower surface energy than a surface energy of the first resin; and a mixture of solvents effective to achieve phase separation of the additive resin from other resin(s) in the composition during spin-coating; and (c) exposing the photoresist layer to actinic radiation.

10. The method of claim 9, wherein $R_2$ is an optionally substituted C3 to C6 isoalkyl group.

11. The method of claim 9, wherein the step c) of exposing the photoresist layer to actinic radiation is an immersion lithography process with water as the immersion fluid, and provides a receding contact angle of greater than 72°.

12. The method of claim 9, wherein the mixture of solvents comprises a dialkyl glycol monoalkyl ether.

13. The method of claim 9, wherein the second resin further comprises as polymerized units a second monomer comprising one or more acid-labile groups.

14. The method of claim 9, wherein the mixture of solvents comprises: a primary solvent and an additive solvent having a boiling point higher than that of the primary solvent, wherein the primary solvent has a boiling point of from 120 to 140° C. and the additive solvent has a boiling point of from 170 to 200° C.

15. The method of claim 14, wherein the additive solvent is present in an amount of from 3 to 15 wt % based on the mixture of solvents.

16. A method of processing a photoresist composition, comprising:
(a) applying a photoresist composition over a substrate to form a photoresist layer;
(b) applying over the photoresist layer a topcoat composition, the composition comprising:
a first matrix resin comprising one or more acidic functional groups;
a second additive resin that is different from the first resin, the second resin comprising as polymerized units a monomer of the formula (I):

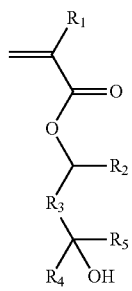

(I)

wherein $R_1$ is hydrogen or a C1 to C6 optionally substituted alkyl or fluoroalkyl group, $R_2$ is an optionally substituted cycloalkyl or branched alkyl group, $R_3$ is an optionally substituted alkylene group and $R_4$ and $R_5$ are independently C1 to C4 fluoroalkyl groups;

wherein the second resin has a lower surface energy than a surface energy of the first resin; and a mixture of solvents effective to achieve phase separation of the additive resin from other resin(s) in the composition during spin-coating, wherein the mixture of solvents comprises: a primary solvent and an additive solvent having a boiling point higher than that of the primary solvent, wherein the primary solvent has a boiling point of from 120 to 140° C. and the additive solvent has a boiling point of from 170 to 200° C.; and (c) exposing the photoresist layer to actinic radiation;

wherein the mixture of solvents comprises: a dialkyl glycol monoalkyl ether; an alcohol; and an alkyl ether or an alkane.

* * * * *